United States Patent
Wendt et al.

(10) Patent No.: US 8,403,388 B1
(45) Date of Patent: Mar. 26, 2013

(54) HYBRID NOZZLE FOR PICK AND PLACE ASSEMBLY OF VERY SMALL FORM FACTOR COMPONENTS

(76) Inventors: Michael Wendt, Hope, MI (US);
Charles Gutentag, Los Angeles, CA (US)

(*) Notice: Subject to any disclaimer, the term of this patent is extended or adjusted under 35 U.S.C. 154(b) by 0 days.

(21) Appl. No.: 13/551,954

(22) Filed: Jul. 18, 2012

Related U.S. Application Data

(60) Provisional application No. 61/572,680, filed on Jul. 20, 2011.

(51) Int. Cl.
*B25J 1/02* (2006.01)
*B66C 1/02* (2006.01)
(52) U.S. Cl. .............................. 294/2; 294/100; 294/183
(58) Field of Classification Search ............ 294/2, 100, 294/183, 185, 186, 188; 29/740, 743; 414/627, 414/752.1, 797, 796.2; 251/65; 73/863.22, 73/864.11
See application file for complete search history.

(56) References Cited

U.S. PATENT DOCUMENTS

| | | | | | |
|---|---|---|---|---|---|
| 1,033,069 | A | * | 7/1912 | Hansen | 294/186 |
| 4,599,037 | A | * | 7/1986 | Ross et al. | 294/2 |
| 4,657,470 | A | * | 4/1987 | Clarke et al. | 414/627 |
| 4,674,784 | A | * | 6/1987 | Wooley | 294/186 |
| 4,770,454 | A | * | 9/1988 | Muscher et al. | 414/752.1 |
| 4,875,279 | A | * | 10/1989 | Sakiadis | 294/188 |
| 5,572,785 | A | * | 11/1996 | Tveit | 294/183 |

* cited by examiner

*Primary Examiner* — Paul T Chin
(74) *Attorney, Agent, or Firm* — Thomas I. Rozsa

(57) ABSTRACT

A hybrid nozzle that includes the use of both vacuum and mechanical gripping of components in a hybrid arrangement. It can easily be scaled down to the smallest foreseeable size of common components. The hybrid nozzle is made from commonly available material using a precision micro-machining process. There are no linkages or moving pistons to complicate the assembly and introduce tolerance buildup and wear concerns. The objective of this invention is to increase both throughput and yield in pick and place assembly operations at automated factories.

21 Claims, 2 Drawing Sheets

HYBRID NOZZLE FOR PICK AND PLACE ASSEMBLY OF VERY SMALL FORM FACTOR COMPONENTS

This patent application claims priority to Provisional Application Ser. No. 61/572,680 filed on Jul. 20, 2011.

BACKGROUND OF THE INVENTION

1. Field of the Invention

The present invention relates to the field of vacuum pick tools which are used to pick components from carrier tapes or other mechanisms for delivering such components to the site of a pick and place machine, wherein the pick and place machine removes the component from its carrier mechanism and moves it to a location on electronic circuit boards.

2. Description of the Prior Art

Vacuum pick tools of conventional design are used for components with the nominal X-Y-Z dimensions as small as 0.5×0.5×0.25 min and a flat upper surface, Such vacuum tools have a conical or pyramid exterior shape and a single through hole fitted to a tubular extension connected to the placement machine vacuum pick tool positioning mechanism to access and pick a repetitive sequence of components on or in continuous carrier tapes when repeatably indexed by a tape feeder to a designated pick point.

Assembly of electronic circuits comprising very small micro-sized surface mount components is one area where precision handling of these units is required. Current methods include picking small components from continuous carrier tapes and then placing them on a circuit board using a vacuum nozzle to contact the top surface of the component. With larger devices there is generally sufficient smooth surface area to enable capture and retention of devices for reliable transport of component from the carrier tapes to a circuit board location without loss of positional accuracy for placement. As the size of components continues to shrink to keep pace with the demand for ever smaller finished assemblies, the surface area available for the vacuum pick nozzle engagement diminishes. With this reduced area and resulting compromise of retention forces, components are frequently not captured (known as "mispicks"). Repeated attempts to capture devices from carrier tape interrupt a continuous smooth production flow and thereby decrease machine throughputs. In other words, fewer completed circuit boards are produced in a given length of time per machine.

Additional problems result from improper pick of devices in a non-correctable orientation, attempted by machine vision. Such loss of orientation results in a rejection of circuit boards in their entirety with proportional loss in yields of finished products. In point of fact, the cost of rework is frequently greater than the loss experienced in classification as "scrap'.

In addition, the integrity of the entire circuit board is compromised as a result of 'off line rework' and becomes unacceptable procedure in many situations. Throughputs and yields are the overarching ratings for successful automated factories and must be continuously improved to remain competitive.

There are also mechanical grippers that are used on larger components that grip the components by their edges. They are generally constructed using a vacuum piston to close the gripper fingers on the component through a system of linkages and pivot points. While this can provide a positive grip on the component, it becomes very difficult to scale the mechanical components down to the level required for these smallest of sizes and control the gripping forces.

SUMMARY OF THE INVENTION

The present invention hybrid nozzle includes the use of both vacuum and mechanical gripping of components in a hybrid arrangement. It can easily be scaled down to the smallest foreseeable size of common components. The hybrid nozzle is made from commonly available material using a precision laser micro-machining process. There are no linkages or moving pistons to complicate the assembly and introduce tolerance buildup and wear concerns.

The present invention hybrid nozzle consists of a hollow tube of a rigid material with a through slot cut into one end that terminates in a circular opening with a diameter larger than the width of the slot. The diameter of this circle is approximately equal to the inside diameter of the starting tube. This circular opening provides a point of flexure that will give the hybrid nozzle its mechanical grip when vacuum is applied. The width of the slot is based on the movement required to grip the component and the width of the component to be gripped. The end of the tube with the slot cut in it has an additional notch cut into it to accommodate the size of the component to be picked up. The notch is sized for the width of the component, whereas the length of component must be at least as long as the outer diameter of the nozzle tube.

In the emerging world of Micro-Electro-Mechanical-Systems ("MEMS") where component dimensions are expressed in microns and unit weights in Micrograms, pick tools of conventional design are not suitable for use. This is especially true where components are odd form and absent an accessible flat upper surface to enable a sustainable vacuum pick tool engagement to ensure capture and possession of each device in a fixed position for assembly placement.

The present invention has as its primary objective, incorporating a means for a hybrid combination of mechanical tweezer action coupled with sustainable vacuum to provide dual means to obtain and maintain positive capture and retention to achieve subsequent positioned placement and release at the assembly location.

Defined in detail, the present invention is a device to be used in conjunction with a pick and place machine to pick up and place very small components of a given width and length, comprising: (a) a hybrid nozzle including the use of both vacuum and mechanical gripping components; (b) the hybrid nozzle including a hollow tube of rigid material having a first end and a second end, having an inside diameter and an outside diameter with a through slot of a given width cut into the first end and extending into the tube that terminates in a circular opening in the tube with a larger diameter than the width of the slot, the circular opening functioning as a hinge point, the circular opening having a diameter approximately equal to the inside diameter of the tube, the first end of the tube having an additional notch sized for a width of a component to be picked up, the outer diameter of the nozzle tube being at least as long as a length of a component to be picked up; (c) a flexible sleeve placed over the tube to completely cover the slot and circular opening but leave the first end of the tube with the notch uncovered; (d) the second end of the tube is adapted to fit a pick tooling of a pick and place machine; and (e) when a vacuum is applied to the second end of the tube through the pick and place machine, the vacuum pulls the small component into the notch in the first end of the tube sealing the inside of the tube from an atmosphere so that the atmospheric pressure then forces the notched end of the hybrid nozzle to close on the sides of the captured component so that the component is held by both vacuum and mechanical mechanisms.

Further novel features and other objects of the present invention will become apparent from the following detailed description and discussion.

BRIEF DESCRIPTION OF THE DRAWINGS

Referring particularly to the drawings for the purpose of illustration only and not limitation, there is illustrated.

DETAILED DESCRIPTION OF THE PREFERRED EMBODIMENTS

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention.

Figure 1:
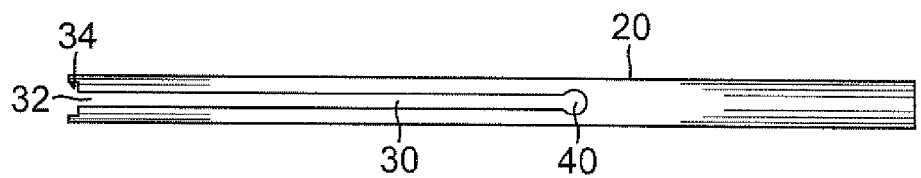
FIG. 1 is side elevational view of the core of the present invention with a slot cut through the device.
Figure 2:
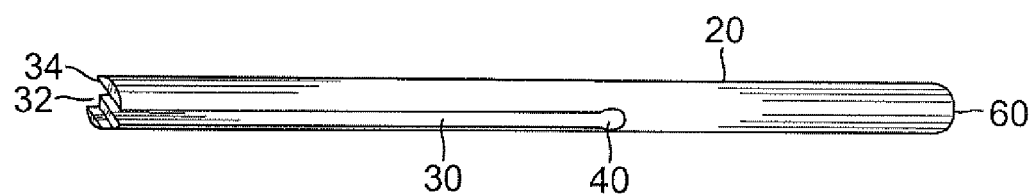
FIG. 2 is a perspective view of the core of the present invention with a slot cut through the device.
Figure 3:
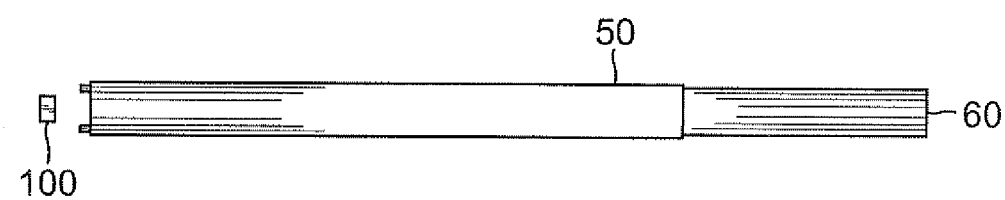
FIG. 3 is side elevational view with a silicone cover covering a portion of the core of the device with a component to be picked illustrated in front of the device.
Figure 4:
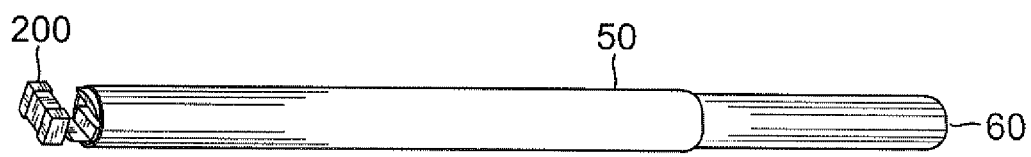
FIG. 4 is a perspective view showing a specific application of the present invention device covered with a silicone sleeve and immediately prior to picking a specific micro part by both a tweezer action and a suction action to retain it.

Referring to FIGS. 1-6, the present invention includes the use of both vacuum and mechanical gripping of components in a hybrid arrangement. It can easily be scaled down to the smallest foreseeable size of common components. The hybrid nozzle is made from commonly available material using a precision laser micro-machining processes. As illustrated in FIGS. 1 and 2, a specific cut is made in the rigid material. There are no linkages or moving pistons to complicate the assembly and introduce tolerance buildup and wear concerns.

Referring to FIGS. 1, 2, 5 and 6, the hybrid nozzle 10 consists of a hollow tube 20 (which can be a 28 gauge hollow needle) of a rigid material with a through slot 30 (which can be 0.004 inches) cut into one end 32 that terminates in a circular opening 40 (which can have a 0.007 inch diameter to use as a hinge point with a larger diameter than the width of the slot as illustrated in both FIGS. 1 and 2. The diameter of the circle 40 is approximately equal to the inside diameter of the starting tube 20. This circular opening provides a point of flexure that will give the hybrid nozzle 10 its mechanical grip when vacuum is applied.

The width of the slot 20 is based on the movement required to grip the component 100, and the width of the component 100 (which can be 0.008 inches) (see FIG. 3) to be gripped. The end 32 of the tube 20 with the slot 30 in it has an additional notch 34 cut into it to accommodate the size of the component 100 to be picked up. The notch 34 is sized for the width of the component, whereas the length of component must be at least as long as the outer diameter of the nozzle tube 20.

A flexible sleeve 50 is placed over the tube 20 to completely cover the slot 30 and circular opening 40, but leave the very end 32 with the notch 34 for the component uncovered. The opposite end 60 is then adapted to fit the pick tooling of various manufacturers' pick and place machines. With this arrangement, when the hybrid nozzle 10 is placed over the component 200 and vacuum is applied to the opposite end 60, vacuum pulls the component 200 firmly into the notch 34 sealing the inside of the tube to atmosphere. The external atmospheric pressure then forces the notched end 32 of the hybrid nozzle 10 to close on the sides of the captured component. When the end 32 is placed over component 200 for a secure positive grasp and vacuum is applied to the end 60, the component 200 is pulled tight to pinch the component 200.

The component 200 is now being held by both vacuum and mechanical means. With this extremely positive grip on the component, the pick and place machine can be sped up to achieve maximum productivity with these small components.

Figure 5:
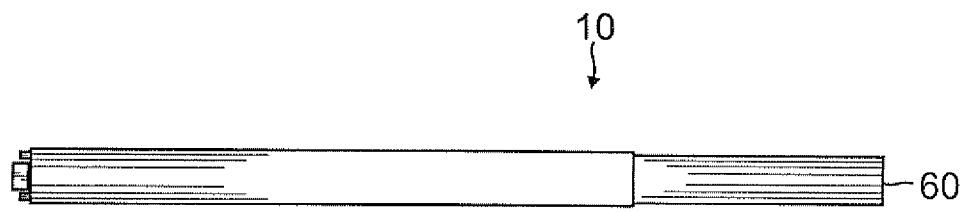
FIG. 5 is a side elevational view of a general component being grasped by the present invention.
Figure 6:
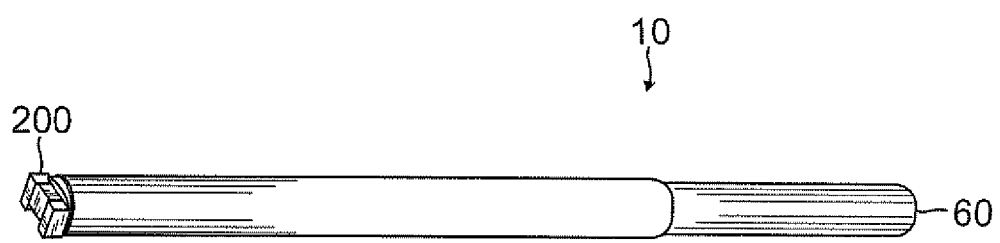
FIG. 6 is a perspective view of a specific component being grasped by the present invention.

When the component is placed on the circuit board and vacuum is released, the end 32 and notch 34 of the hybrid nozzle spring open and the part 200 is released at a very precise location. For the specific part 200, this is illustrated in FIGS. 5 and 6. Adjusting the length of the slot cut 30 through the tube 20 easily controls the gripping force of the hybrid nozzle 10. A short slot reduces the area that atmospheric pressure acts on when vacuum is applied producing a small gripping force. Increasing the length of the slot 30 would therefore increase the gripping force as needed.

The hybrid nozzle will improve the speed and accuracy of pick and place systems while also greatly reducing the possibility of miss picks. The slim design of the hybrid nozzle allows very close placement of components on the circuit boards. The benefits of the hybrid nozzle can be further exploited to enable the use of adhesive based carrier tapes where plain vacuum nozzles with limited gripping force will not work on the smaller sized components.

The new carrier tapes provide better control of component location for the pick operation and can be used to increase the density of components carried in the tapes. An example of a hybrid nozzle for a 01005 size component is included as a plan view and isometric view illustrated in FIGS. 5 and 6.

Further consideration for the embodiment of this invention would be for the use in medical apparatus. With very minor and obvious changes to the shape of the gripper portion of the nozzle it can be used as a gripping tool on the end of various catheters used in invasive medical procedures. The various shapes required can easily be accommodated using current additive manufacturing techniques. It may for example be used to replace the stone basket in kidney stone removal and ablation procedures to easily provide more accurate and secure capture of the stone. With the ability to be scaled to the smallest of sizes, it could easily be employed to remove blood clots during cardiac and vein catheterizations by providing vacuum and mechanical gripping of the clot. The inclusion of cutting edges to the end of the gripper would enable its use in obtaining biopsy samples during minimally invasive procedures.

Of course the present invention is not intended to be restricted to any particular form or arrangement, or any specific embodiment, or any specific use, disclosed herein, since the same may be modified in various particulars or relations without departing from the spirit or scope of the claimed invention hereinabove shown and described of which the apparatus or method shown is intended only for illustration and disclosure of an operative embodiment and not to show all of the various forms or modifications in which this invention might be embodied or operated.

What is claimed is:

1. A device to be used in conjunction with a pick and place machine to pick up and place very small components of a given width and length, comprising:
   a. a hybrid nozzle including the use of both vacuum and mechanical gripping components;
   b. the hybrid nozzle including a hollow tube of rigid material having a first end and a second end, having an inside diameter and an outside diameter with a through slot of a given width cut into the first end and extending into the tube that terminates in a circular opening in the tube with a larger diameter than the width of the slot, the circular opening functioning as a hinge point, the circular opening having a to diameter approximately equal to the inside diameter of the tube, the first end of the tube having an additional notch sized for a width of a component to be picked up, the outer diameter of the nozzle tube being at least as long as a length of a component to be picked up;
   c. a flexible sleeve placed over the tube to completely cover the slot and circular opening but leave the first end of the tube with the notch uncovered;
   d. the second end of the tube is adapted to fit a pick tooling of a pick and place machine; and
   e. when a vacuum is applied to the second end of the tube through the pick and place machine, the vacuum pulls the small component into the notch in the first end of the tube sealing the inside of the tube from an atmosphere so that the atmospheric pressure then forces the notched end of the hybrid nozzle to close on the sides of the captured component so that the component is held by both vacuum and mechanical mechanisms.

2. The device in accordance with claim 1, further comprising:
   a. when the component is placed on a circuit board and the vacuum is released, the first end and notch spring open and the component is released at a very precise location.

3. The device in accordance with claim 1, further comprising:
   a. the hollow tube is a 28 gauge hollow needle.

4. The device in accordance with claim 1, further comprising:
   a. the circular opening is 0.007 inches in diameter.

5. The device in accordance with claim 1, further comprising:
   a. the slot has a width of 0.004 inches.

6. The device in accordance with claim 1, further comprising:
   a. the component has a length of 0.016 inches.

7. The device in accordance with claim 1, further comprising:
   a. the sleeve is made of silicone.

8. A device to be used in conjunction with a pick and place machine to pick up and place very small components of a given width and length, comprising:
   a. a hybrid nozzle including the use of both vacuum and mechanical gripping components;
   b. the hybrid nozzle including a hollow tube having a first end and a second end, having an inside diameter and an outside diameter with a through slot of a given width cut into the first end and extending into the tube and that terminates in a circular opening in the tube, the circular opening functioning as a hinge point, the first end of the tube having an additional notch sized for a width of a component to be picked up, the outer diameter of the nozzle tube being at least as long as a length of a component to be picked up;
   c. a flexible sleeve placed over the tube to completely cover the slot and circular opening but leave the first end of the tube with the notch uncovered;
   d. the second end of the tube is adapted to fit a pick tooling of a pick and place machine; and
   e. when a vacuum is applied to the second end of the tube through the pick and place machine, the vacuum pulls the small component into the notch in the first end of the tube sealing the inside of the tube from an atmosphere so that the atmospheric pressure then forces the notched end of the hybrid nozzle to close on the sides of the captured component so that the component is held by both vacuum and mechanical mechanisms.

9. The device in accordance with claim 8, further comprising:
   a. when the component is placed on a circuit board and the vacuum is released, the first end and notch spring open and the component is released at a very precise location.

10. The device in accordance with claim 8, further comprising:
    a. the hollow tube is a 28 gauge hollow needle.

11. The device in accordance with claim 8, further comprising:
    a. the circular opening is 0.007 inches in diameter.

12. The device in accordance with claim 8, further comprising:
    a. the slot has a width of 0.004 inches.

13. The device in accordance with claim 8, further comprising:
    a. the component has a length of 0.016 inches.

14. The device in accordance with claim 8, further comprising:
    a. the sleeve is made of silicone.

15. A device to be used in conjunction with a pick and place machine to pick up and place very small components of a given width and length, comprising:
    a. a hybrid nozzle including the use of both vacuum and mechanical gripping components;
    b. the hybrid nozzle including a hollow tube having a first end and a second end, having an inside diameter and an outside diameter with a through slot of a given width cut into the first end and extending into the tube and that terminates in an opening in the tube, the opening functioning as a hinge point, the first end of the tube having an additional notch sized for a width of a component to be picked up, the outer diameter of the nozzle tube being at least as long as a length of a component to be picked up;
    c. a flexible sleeve placed over the tube to completely cover the slot and circular opening but leave the first end of the tube with the notch uncovered;
    d. the second end of the tube is adapted to fit a pick tooling of a pick and place machine; and
    e. when a vacuum is applied to the second end of the tube through the pick and place machine, the vacuum pulls the small component into the notch in the first end of the tube sealing the inside of the tube from an atmosphere so that the atmospheric pressure then forces the notched end of the hybrid nozzle to close on the sides of the captured component so that the component is held by both vacuum and mechanical mechanisms.

16. The device in accordance with claim 15, further comprising:

a. when the component is placed on a circuit board and the vacuum is released, the first end and notch spring open and the component is released at a very precise location.

17. The device in accordance with claim 15, further comprising:

a. the hollow tube is a 28 gauge hollow needle.

18. The device in accordance with claim 15, further comprising:

a. the circular opening is 0.007 inches in diameter.

19. The device in accordance with claim 15, further comprising:

a. the slot has a width of 0.004 inches.

20. The device in accordance with claim 15, further comprising:

a. the component has a length of 0.016 inches.

21. The device in accordance with claim 15, further comprising:

a. the sleeve is made of silicone.

* * * * *